(12) United States Patent
Reboh et al.

(10) Patent No.: US 11,450,755 B2
(45) Date of Patent: Sep. 20, 2022

(54) ELECTRONIC DEVICE INCLUDING AT LEAST ONE NANO-OBJECT

(71) Applicants: COMMISSARIAT A L'ENERGIE ATOMIQUE ET AUX ENERGIES ALTERNATIVES, Paris (FR); INTERNATIONAL BUSINESS MACHINES CORPORATION, Yorktown Heights, NY (US)

(72) Inventors: Shay Reboh, Grenoble (FR); Emmanuel Augendre, Montbonnot (FR); Remi Coquand, Les Marches (FR); Nicolas Loubet, Guilderland, NY (US)

(73) Assignees: COMMISSARIAT A L'ENERGIE ATOMIQUE ET AUX ENERGIES ALTERNATIVES, Paris (FR); INTERNATIONAL BUSINESS MACHINES CORPORATION, Yorktown Heights, NY (US)

(*) Notice: Subject to any disclaimer, the term of this patent is extended or adjusted under 35 U.S.C. 154(b) by 161 days.

(21) Appl. No.: 16/904,138

(22) Filed: Jun. 17, 2020

(65) Prior Publication Data
US 2020/0321452 A1      Oct. 8, 2020

Related U.S. Application Data

(62) Division of application No. 15/858,266, filed on Dec. 29, 2017, now Pat. No. 10,727,320.

(51) Int. Cl.
*H01L 29/66* (2006.01)
*H01L 29/78* (2006.01)
(Continued)

(52) U.S. Cl.
CPC ........ *H01L 29/66795* (2013.01); *B82Y 10/00* (2013.01); *H01L 29/0673* (2013.01);
(Continued)

(58) Field of Classification Search
CPC ........... H01L 29/66795; H01L 29/0673; H01L 29/0847; H01L 29/7848; H01L 29/165
See application file for complete search history.

(56) References Cited

U.S. PATENT DOCUMENTS 8,420,464 B2   4/2013   Basker et al.
8,492,208 B1   7/2013   Cohen
(Continued)

FOREIGN PATENT DOCUMENTS

WO    WO 2014/004033 A1    1/2014

OTHER PUBLICATIONS

Extended European Search Report dated Jun. 17, 2019 in European Patent Application No. 18306759.4 (with English translation of Category of Cited Documents), 11 pages.
(Continued)

*Primary Examiner* — Changhyun Yi
(74) *Attorney, Agent, or Firm* — Oblon, McClelland, Maier & Neustadt, L.L.P.

(57) ABSTRACT

An electronic device is provided, including a transistor and a substrate surmounted by first through third elements, the second element being arranged between the first and the third elements and including a nano-object, a transistor channel area being formed by part of the nano-object, a first end of the nano-object being connected to the first element by a first electrode including a first part forming a first continuity of matter and a second part formed on the first part, a second end of the nano-object being connected to the third element by a second electrode including a first part forming a second continuity of matter and a second part
(Continued)

formed on the first part, such that a lattice parameter of the second part is suited to a lattice parameter of the first part to induce a stress in the nano-object along a reference axis.

20 Claims, 8 Drawing Sheets

(51) Int. Cl.
| | |
|---|---|
| *H01L 29/165* | (2006.01) |
| *H01L 29/06* | (2006.01) |
| *H01L 29/08* | (2006.01) |
| *H01L 29/417* | (2006.01) |
| *B82Y 10/00* | (2011.01) |
| *H01L 29/40* | (2006.01) |
| *H01L 29/775* | (2006.01) |

(52) U.S. Cl.
CPC ........ *H01L 29/0847* (2013.01); *H01L 29/165* (2013.01); *H01L 29/401* (2013.01); *H01L 29/41725* (2013.01); *H01L 29/66439* (2013.01); *H01L 29/66545* (2013.01); *H01L 29/775* (2013.01); *H01L 29/785* (2013.01); *H01L 29/7848* (2013.01); *H01L 2029/7858* (2013.01)

(56) References Cited

U.S. PATENT DOCUMENTS

| | | | |
|---|---|---|---|
| 9,397,179 B1 | 7/2016 | Seo | |
| 9,490,335 B1 | 11/2016 | Doris | |
| 9,691,851 B1 | 6/2017 | Fung | |
| 9,748,335 B1 | 8/2017 | Bentley et al. | |
| 10,263,077 B1 | 4/2019 | Reboh | |
| 10,340,340 B2 | 7/2019 | Bao | |
| 2010/0193882 A1 | 8/2010 | Hoentschel et al. | |
| 2013/0341704 A1 | 12/2013 | Rachmady | |
| 2014/0151638 A1* | 6/2014 | Chang | H01L 29/0673 257/27 |
| 2015/0295036 A1 | 10/2015 | Hong | |
| 2015/0295084 A1 | 10/2015 | Obradovic | |
| 2015/0349085 A1 | 12/2015 | Liu et al. | |
| 2016/0197075 A1 | 7/2016 | Li et al. | |
| 2017/0110554 A1* | 4/2017 | Tak | H01L 29/4991 |
| 2017/0141112 A1 | 5/2017 | Ching | |
| 2017/0141198 A1 | 5/2017 | Cheng | |
| 2017/0194213 A1 | 7/2017 | Ching | |
| 2017/0236900 A1 | 8/2017 | Chang et al. | |
| 2017/0271514 A1 | 9/2017 | Kittl | |
| 2018/0090624 A1 | 3/2018 | Cheng | |
| 2018/0197794 A1 | 7/2018 | Kang | |

OTHER PUBLICATIONS

Barraud, S. et al. "Vertically Stacked-Nano Wires MOSFETs in a Replacement Metal Gate Process with Inner Spacer and SiGe Source/Drain" IEEE, 2016, 4 pages.

N. Loubet, et al. "Stacked Nanosheet Gate-All-Around Transistor to Enable Scaling Beyond FinFET", 2017 Symposium on VLSI Technology Digest of Technical Papers, 2017, 2 pages.

* cited by examiner

ELECTRONIC DEVICE INCLUDING AT LEAST ONE NANO-OBJECT

CROSS-REFERENCE TO RELATED APPLICATION

This application is a divisional of U.S. application Ser. No. 15/858,266, filed Dec. 29, 2017, the entire contents of which are incorporated herein by reference.

TECHNICAL FIELD

The technical field of the invention concerns field effect transistors, notably gate-all-around transistors, and in particular a method of manufacturing at least one such transistor.

DESCRIPTION OF THE RELATED ART

In the field of transistors, there is a "Gate-All-Around" configuration also known under the abbreviation GAA. In such a configuration, the gate electrode of the transistor surrounds a channel area of the transistor, notably with the interposition of a gate insulator.

A known method of manufacturing a pMOS type (abbreviation of "P-Type Metal Oxide Semiconductor") gate-all-around field effect transistor is as follows. A stack of nanowires comprising an alternation of silicon nanowires and silicon-germanium (SiGe) nanowires is formed on a substrate. A sacrificial gate is formed on this stack, then external spacers are arranged on each side of the sacrificial gate, so as to cover a part of the stack. The sacrificial gate and the external spacers are formed thanks to suitable steps for the lithography and etching of deposited materials. The parts of the nanowires of the stack that extend outside the covering formed by the sacrificial gate and the external spacers are removed, e.g. by etching. Next the longitudinal ends of the silicon-germanium nanowires are etched horizontally, i.e. along their elongation axes so as to form recesses which are then filled with an electrical insulating material for forming internal spacers, the role of which is, in collaboration with the external spacers, to separate the future source and drain electrodes of the future gate electrode in order to improve the transistor performance by reducing parasitic capacitances. Next, the source and drain electrodes are formed by epitaxy in the continuity of the silicon nanowires that have been preserved under the sacrificial gate and the external spacers. The source and drain electrodes are then encapsulated in a passivation or encapsulation material. Next, the sacrificial gate is removed to reveal parts of the nanowires between the external spacers. The rest of the SiGe nanowires are removed by selective etching. Next, a gate insulator is formed around each silicon nanowire along its elongation axis, then a gate material is deposited so as to form a gate electrode surrounding the silicon nanowires along their elongation axis.

It is known that a tensile stress in the channel area of a transistor is beneficial for nMOS type (abbreviation of "N-Type Metal Oxide Semiconductor") transistors but is problematic for pMOS type transistors, for which a compressive stress in the channel area is sought. The method of manufacturing described above does not in any significant way enable any tensile or compressive stress to be introduced into the channel area. As a result there is a need to find a solution for obtaining a transistor, the channel area of which is deliberately stressed, according to the desired case nMOS or pMOS, in tension or in compression.

SUMMARY

The purpose of the invention is a method of manufacturing at least one transistor, a part of which is intended to form a suitably stressed channel area of the transistor.

This purpose is furthered thanks to a method of manufacturing at least one field-effect transistor, this method of manufacturing comprising:
  a step of supplying a substrate surmounted by first, second and third structures, the second structure being arranged between the first and third structures, the second structure comprising at least one first nano-object located away from the substrate, a part of the first nano-object of the second structure being intended to form a channel area of the transistor, the first nano-object comprising first and second opposite ends along a reference axis passing through said first and second ends,
  a step of forming electrodes of the transistor comprising:
    a step of epitaxial growth of a first material which results in obtaining a first continuity of matter made of first material connecting, along the reference axis, the first end of the first nano-object of the second structure to the first structure, and obtaining a second continuity of matter made of first material connecting, along the reference axis, the second end of the first nano-object of the second structure to the third structure,
    a step of epitaxial growth of a second material, starting from the first material of the first and second continuities of matter, the second material having a different lattice parameter from the lattice parameter of the first material of the first and second continuities of matter which results in the second material being stressed.

Such a method of manufacturing offers the advantage of suitably stressing to the channel area by using structures, arranged on each side of the channel area, and electrodes, generally constituting the source and drain electrodes connected to the channel area.

The method of manufacturing may comprise one or more of the following features:
  the step of epitaxial growth of the first material is implemented at least from the first, second and third structures;
  the method of manufacturing comprises a step of forming a growth mask for forming confinement spaces in which the epitaxial growth of the first material is performed, and a step of removing the growth mask before implementing the step of epitaxial growth of the second material
  the step of epitaxial growth of the first material is such that said growth of the first material is also performed from the substrate, notably from a first free area of the substrate located between the first and second structures and from a second free area of the substrate located between the second and third structures;
  the step of forming electrodes comprises:
    a step of forming protections arranged in the extension of the first and second continuities of matter, the first and second continuities of matter each being arranged between one of the protections and the substrate, then
    a step of lateral etching of the first material so as to thin down the first and second continuities of matter before implementing the step of epitaxial growth of the second material;

the step of forming the protections is performed after the step of removing the growth mask and before the step of epitaxial growth of the second material;

the step of lateral etching makes it possible to reveal:
on each side of the first continuity of matter, portions of the first end of the first nano-object of the second structure,
on each side of the second continuity of matter, portions of the second end of the first nano-object of the second structure;

that after the step of lateral etching:
the step of epitaxial growth of the second material is performed while the protections are present, or
the method of manufacturing comprises a step of removing the protections before performing the step of epitaxial growth of the second material;

the step of epitaxial growth of the first material takes place from the first, second and third structures and in such a way that:
between the first and second structures, the first material grows on the one hand, from the first structure toward the second structure, and, on the other hand, from the second structure toward the first structure which results in the presence of two growth fronts between the first and second structures,
between the second and third structures, the first material grows on the one hand, from the third structure toward the second structure, and, on the other hand, from the second structure toward the third structure which results in the presence of two growth fronts between the second and third structures, the step of epitaxial growth of the first material being stopped consecutively to the growth fronts between the first and second structures and the growth fronts between the second and third structures making contact;

the substrate is such that it has, before the implementation of the step of epitaxial growth of the first material, a first free area connecting the first structure to the second structure and a second free area connecting the second structure to the third structure, the first and second free areas being made of dielectric material from which the epitaxial growth of the first material is inhibited;

the first material, preferably doped, is silicon or silicon-germanium, and the second material, preferably doped, is silicon-germanium;

the first material is $Si_{(1-x)}Ge_x$ or Si, and the second material is $Si_{(1-y)}Ge_y$, with x>0, y>0 and x being strictly less than y;

the method of manufacturing comprises, after the step of epitaxial growth of the second material, a step of annealing;

the method of manufacturing comprises a step of forming a gate electrode of the transistor which surrounds, preferably with the interposition of a gate insulator, the part of the first nano-object coming from the second structure and intended to form the channel area of the transistor;

the step of supplying is such that:
the second structure comprises second sacrificial nano-objects, and the first nano-object of the second structure is arranged between, and in contact with, two second nano-objects of the second structure for forming a stack of nano-objects, and
an intermediate part of said stack of nano-objects is covered by a sacrificial gate located between first and second spacers covering end parts of said stack located on each side of the intermediate part, the first and second opposite ends of said first nano-object of the stack of nano-objects being accessible at the level of the first and second spacers;

before forming the gate electrode of the transistor, the method of manufacturing comprises a step of removing the sacrificial gate and a step of etching the second nano-objects made accessible by the removal of the sacrificial gate for freeing said part of the first nano-object of the second structure intended to form the channel area of the transistor, then the step of forming the gate electrode makes it possible to form said gate electrode between the first and second spacers.

The invention also relates to an electronic device comprising at least one transistor, a substrate surmounted by first, second and third elements, the second element being arranged between the first and third elements, the second element comprising at least one nano-object and the transistor being provided with a channel area formed by a part of said nano-object, said nano-object comprising first and second opposite ends along a reference axis passing through the first and second ends, said electronic device being such that:
the first end of the nano-object is connected to the first element via a first electrode of the transistor, said first electrode comprising:
a first part forming a first continuity of matter between said first end and the first element,
a second part formed on said first part,
the second end of the nano-object is connected to the third element via a second electrode of the transistor, said second electrode comprising:
a first part forming a second continuity of matter between said second end and the third element,
a second part formed on said first part,
the first parts of the first and second electrodes being formed of a first material and the second parts of the first and second electrodes being formed of a second material, the lattice parameter of the second material being suited to that of the first material so as to induce a stress in the nano-object along the reference axis.

BRIEF DESCRIPTION OF THE DRAWINGS

The invention will be better understood on reading the following description of particular embodiments of the invention, given solely by way of non-restrictive example and referring to the drawings, in which.

In these figures, the same references are used for designating the same elements.

Figure 1:
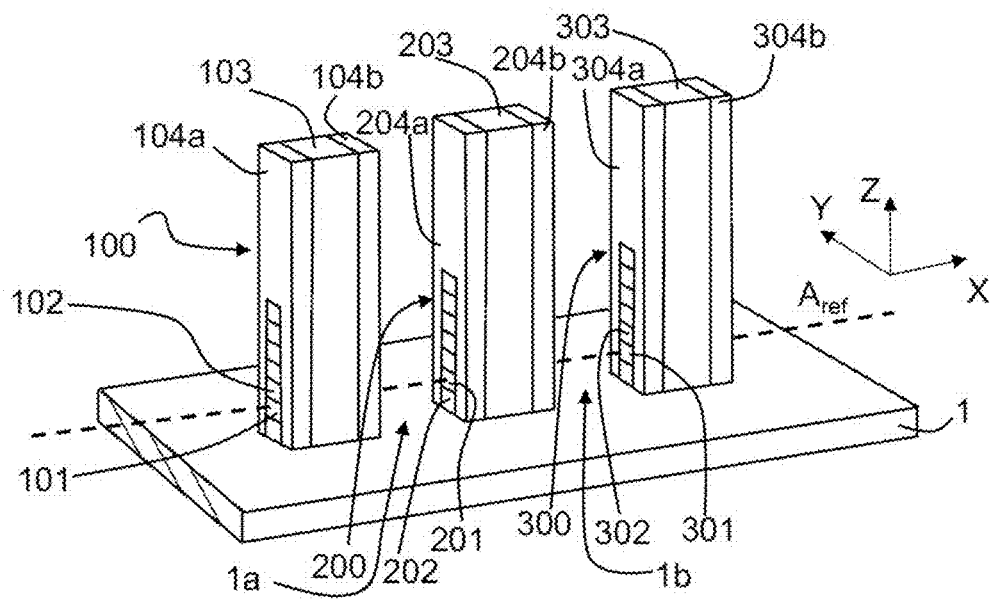
FIG. 1 illustrates a perspective view depicting a state of the transistor during the method of manufacturing thereof.

Furthermore, for reasons of understanding the figures, the elements represented in the various figures are schematic, and are not necessarily represented according to a uniform scale.

DETAILED DESCRIPTION

In the present description, the terms that depend on orientation, such as "above", "lateral" apply considering the orientation represented in the figures according to the orthogonal coordinate system of X, Y, Z axes, with Z pointing upward. The axes of this coordinate system are orthogonal two-by-two. In particular, unless otherwise stipulated, a thickness is measured in a direction parallel to the Z-axis, a length is measured in a direction parallel to the X-axis, a lateral dimension is measured in a direction parallel to the Y-axis, and a height is measured in a direction parallel to the Z-axis. The plane defined by the X and Y axes is a plane parallel to the substrate described below. The sectional planes of FIGS. 2, 8, 10, 20, 21, 22, 23 are given along planes parallel to the plane defined by the X and Z axes. A measurement or a dimension, along an axis or a direction, may be performed, or given, parallel to this axis or to this direction.

In the present description, the term "parallel" may be replaced by "substantially parallel" insofar as tolerances are accepted in the field.

In the present description, the term "orthogonal" may be replaced by "substantially orthogonal" insofar as tolerances are accepted in the field.

In the present description, "-based", is understood to mean "mainly comprises".

In the present description, when two values are comprised between two limits, the limits are included.

In the present description, the term nano-object may correspond to an element of elongated shape regardless of the shape of the profile of its cross section. Dimensions of the nano-object are described below. More generally, the term nano-object equally designates a nanowire, a nanosheet or a nanobar. If the nano-object is a nanowire, its first and second opposite ends as described below are preferably opposite longitudinal ends.

In the present description, a stress along an axis is a stress given along this axis or parallel to this axis.

In the present description, a lattice parameter of a material in the relaxed state corresponds to its value when it is in an unstressed natural state. A lattice parameter of a given material forming a thing, for example a continuity of matter or a part of an electrode, corresponds to the actual value of the lattice parameter of the given material within this thing, this value may be different from that of the given material in the relaxed state if the given material of said thing is stressed, or may be equal to that of the given material in the relaxed state if the given material is in the relaxed state.

The present invention proposes to anchor a given structure, intended to participate in forming a transistor, to two other structures. This anchoring is used for inducing a tensile or compressive stress in a channel area of the future transistor formed in said given structure thanks to suitable steps of growth, notably by epitaxy, of two electrodes performed simultaneously and in two stages, these two electrodes notably being source and drain electrodes of the transistor.

A stress within the meaning of the present description is a mechanical stress which may be tensile or compressive preferably along an axis of a nano-object, a part of which is intended to form the transistor channel area. The axis of the nano-object here extends between two opposite ends of the nano-object intended to be connected respectively to a source electrode and a drain electrode.

A reference axis within the meaning of the present description is an axis passing through first and second opposite ends of a corresponding nano-object intended to be connected to electrodes, notably to the source and drain electrodes of the transistor. This reference axis may be seen as the axis referred to above of the nano-object. When the reference axis is represented in the figures, it is represented as a dotted line with the reference $A_{ref}$.

Figure 2:
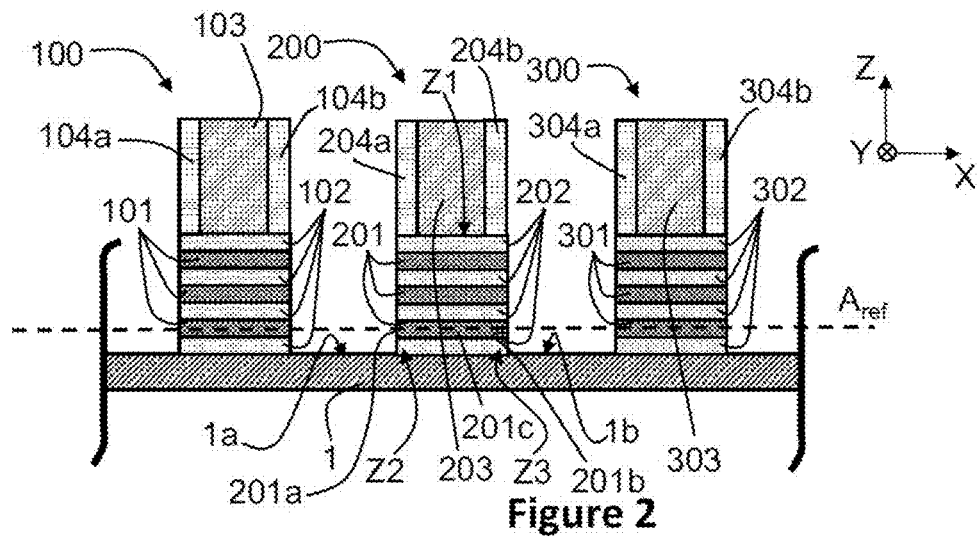
FIG. 2 is a sectional view of FIG. 1.

The method of manufacturing at least one field effect transistor, notably one with a gate-all-around electrode, comprises, as illustrated in FIGS. 1 and 2, a step of supplying a substrate 1 surmounted by a first structure 100, by a second structure 200 and by a third structure 300. These first to third structures 100, 200, 300 are notably fixed to the substrate 1. The second structure 200 is arranged between the first and third structures 100, 300. The second structure 200, and preferably each of the first, second and third structures 100, 200, 300, comprises at least one nano-object 101, 201, 301, usually called "first nano-object" in the following description, located away from the substrate 1. "At least one first nano-object", is understood to mean that the corresponding structure may comprise one first nano-object or several first nano-objects. In other words, for a given structure, everything that applies to a first nano-object of the given structure may apply to several first nano-objects, and notably to each first nano-object, of this given structure. "Located away from the substrate 1", is understood to mean that the first nano-object 101, 201, 301 is not in direct contact with the substrate 1, this is notably necessary for making it possible to later produce a gate-all-around electrode, i.e. surrounding a part 201c of a first nano-object 201. The part 201c of the first nano-object 201 of the second structure 200 is intended to form a channel area of the transistor, this part 201c is located between first and second opposite ends 201a, 201b of said first nano-object 201. These first and second ends 201a, 201b are opposite along the reference axis $A_{ref}$ passing through said first and second ends 201a, 201b. Where appropriate, a part of the first nano-object 101 of the first structure 100 is intended to form a channel area of another transistor and a part of the first nano-object 301 of the third structure 300 is intended to form a channel area of yet another transistor. The channel area—also called a channel region in the field—for a first nano-object corresponds to a segment, or part, of the first nano-object that will be surrounded, or according to a different formulation wrapped, by the corresponding gate electrode of the transistor. Notably, a gate insulator is interposed between the gate electrode and the channel area. Clearly then according to circumstances, each transistor may comprise one or more channel areas, each channel area then being formed by a part of a corresponding first nano-object. Where appropriate, in the present description, a structure may be according to the context one of the first to third structures.

As illustrated in FIGS. 1 and 2, the first to third structures 100, 200, 300 are aligned. It is said that the first and second structures 100, 200 are adjacent and separated by an empty space which will then be filled at least partially for forming an electrode of the transistor therein (the source electrode or the drain electrode as applicable) which will be formed at least starting from (i.e. notably at least from) the second structure 200. Furthermore, it is said that the second and third structures 200, 300 are adjacent and separated by an empty space which will then be filled at least partially for forming another electrode of the transistor therein (the drain electrode or the source electrode as applicable) which will be formed at least starting from (i.e. notably at least from) the second structure 200. If the first and third structures 100, 300 are also used during the method of manufacturing for forming transistors, the electrodes formed between the first and second structures 100, 200, and between the second and third structure 200, 300, will each be common to two adjacent transistors. The alignment of the first to third structures 100, 200, 300, is notably such that the reference axis $A_{ref}$ described above passes through the first to third structures 100, 200, 300.

FIGS. 1 and 2 represent three aligned structures, however, a plurality of identical aligned structures may be formed so as to form a line of structures for the purpose of forming transistors: there is then a line of structures. In this case, except the structures located at the ends of the line of structures which may only serve as the anchoring described below, each of the structures located between the end structures may be used to form a functional transistor. In this case, two adjacent transistors formed starting from two adjacent structures may share the same electrode. In this respect, each structure comprised between the end structures of the line of structures may be treated as a second structure within the meaning of the present description and arranged between first and third structures which are immediately adjacent thereto. It is notably in this respect that FIGS. 1 to 23 represent at least one part of a substrate truncated on its left and on its right in the reference frame of these figures: other structures may be formed on the substrate on each side of the first to third structures represented.

The structures, notably the first to third structures may be identical, or similar, i.e. they comprise the same elements, notably obtained simultaneously by microelectronic technology steps.

Preferably (FIGS. 1 and 2), the first nano-object 101 of the first structure 100 is aligned with the corresponding first nano-object 201 of the second structure 200 and with the corresponding first nano-object 301 of the third structure 300. According to another formulation, a triplet of first nano-objects 101, 201, 301 each associated with a different structure may each extend along the same axis (parallel to the X-axis) e.g. represented by the reference axis $A_{ref}$: first nano-objects of two adjacent structures are coaxial but separated along said axis $A_{ref}$ by a predetermined distance, e.g. this distance may be comprised between 10 nm and 150 nm. According to yet another formulation for a triplet of given first nano-objects 101, 201, 301, the nano-objects are arranged in the extension of each other, and separated from each other by the predetermined distance: they are not in direct contact.

In particular, in FIGS. 1 and 2, the step of supplying the substrate 1 surmounted by first to third structures 100, 200, 300 may be such that the or at least the, second structure 200, and notably each of the first, second and third structures 100, 200, 300 comprises second nano-objects 102, 202, 302. In other words, everything that applies in the present description to the second structure 200 may also apply to the first and third structures 100, 300 which comprise the same components generally formed simultaneously when they are of the same type. These second nano-objects 202 are sacrificial second nano-objects 202, i.e. they are intended to be removed during the method of manufacturing the transistor. In this respect, the first nano-object 201 of the second structure 200 is arranged between (notably along the Z-axis), and in contact with, two second nano-objects 202 of the second structure 200 for forming a stack of nano-objects. The stack of nano-objects of the second structure 200 is made so that axes, notably longitudinal axes, of said nano-objects of the stack are parallel to each other but shifted along the Z-axis. In other words, the height of the stack along the stacking direction of the nano-objects may be measured with respect to the substrate, which then forms the bottom point. In other words, the stack of nano-objects rises above the substrate 1, i.e. the stacking direction of the nano-objects (first and second nano-objects) is orthogonal to the substrate. Preferably, the step of supplying is also such that an intermediate part Z1 (FIG. 2) of the stack of nano-objects of the second structure 200 is covered by a sacrificial gate 203 of the second structure 200. The sacrificial gate 203 is located between the first and second spacers 204a, 204b (also called external spacers in the field) of the second structure 200. These first and second spacers 204a, 204b are intended to form part of the transistor. The sacrificial gate 203 may extend from the substrate 1. The first and second spacers 204a, 204b of the second structure 200 cover end parts Z2, Z3 of said stack of nano-objects of the second structure 200 located on each side, and preferably in continuity, of the intermediate part Z1 of the stack of nano-objects of the second structure 200. The first and second spacers 204a, 204b of the second structure 200 may extend from the substrate 1. The first and second opposite ends 201a, 201b of the first nano-object 201 of the stack of nano-objects of the second structure 200 are accessible at the level of the first and second spacers 204a, 204b of the corresponding stack of nano-objects. "First and second opposite ends accessible at the level of the first and second spacers", is understood to mean that the first and second spacers 204a, 204b each comprise an external face from which one of the first and second ends 201a, 201b of the first nano-object 201 is accessible, these external faces being oriented in opposite directions. The first structure 100 may also comprise a sacrificial gate 103, and first and second spacers 104a, 104b. Furthermore, the third structure 300 may also comprise a sacrificial gate 303, and first and second spacers 304a, 304b. The manufacture of these structures comprising sacrificial gates and spacers is known per se to the person skilled in the art, and offers the advantage of making the manufacture of GAA type transistors possible. Notably, the nano-objects, the sacrificial gate and the first and second spacers may each be etched selectively. Each sacrificial gate 103, 203, 303 may be formed of a material such as silicon or silicon-germanium, this material being amorphous or polycrystalline. A sacrificial gate within the meaning of the present description may have a dimension measured along the reference axis $A_{ref}$ (i.e. along the X-axis) comprised between 5 nm and 150 nm, a height comprised between 20 nm and 200 nm, and a lateral dimension suited to the structural requirements. The first and second spacers may in turn each be formed of a dielectric material such as SiN (silicon nitride) or SiBCN (silicon-boron-carbon nitride). Each of the first and second spacers may have a dimension measured along the reference axis $A_{ref}$ associated with the first nano-object that it partly covers comprised between 3 nm and 20 nm, a height corresponding to the height of the sacrificial gate, and a lateral dimension suited to the requirements.

In the example of FIGS. 1 and 2, the first to third structures 100, 200, 300 each comprise three first nano-objects 101, 201, 301 each in contact with two second nano-objects 102, 202, 302: there are thus four second nano-objects 102, 202, 302 in each of the first, second and third structures 100, 200, 300. More particularly, each structure is, in fact, a stack of first and second nano-objects. In this respect, it is said that each of the first to third structures 100, 200, 300 may comprise an alternation of first nano-objects and second nano-objects. Notably, each first nano-object 101 of the first structure 100 is located in the alignment of one of the first nano-objects 201 of the second structure 200 and one of the first nano-objects 301 of the third structure 300, and each second nano-object 102 of the first structure 100 is located in the alignment of one of the second nano-objects 202 of the second structure 200 and one of the second nano-objects 302 of the third structure 300. In other words, each first nano-object 101 of the first structure 100 extends along a common axis with a corresponding first nano-object 201 of the second structure 200 and a corresponding first nano-object 301 of the third structure 300, and each second nano-object 102 of the first structure 100 extends along a common axis with a corresponding second nano-object 202 of the second structure 200 and with a corresponding second nano-object 302 of the third structure 300.

In a preferred way, each first nano-object 101, 201, 301 is made of semiconductor material, e.g. each first nano-object 101, 201, 301 is a silicon or silicon-based nano-object. Furthermore, where appropriate, each second nano-object 102, 202, 302 may be made of semiconductor material such as, for example, silicon-germanium, or may be silicon-germanium-based. In fact, the material used for forming the second nano-objects 102, 202, 302 is chosen so as to offer a selectivity of etching with respect to the material of each first nano-object 101, 201, 301. When the material of each first nano-object 101, 201, 301 is silicon, and the material of each second nano-object is silicon-germanium with the formula $Si_{1-k}Ge_k$ with k>0 and 1−k>0, the latter may have a concentration in germanium such that k is comprised between 0.15 and 0.6. Hereafter, SiGe corresponds, in general, to silicon-germanium without implying that silicon and germanium are in equal proportion, notably SiGe may have the formula $Si_{1-k}Ge_k$ given above. The advantage of these two aforementioned materials is that it is possible to perform a selective etching of the second nano-objects 102, 202, 302 while preserving each first nano-object 101, 201, 301, which etching may be HCl-based dry etching. SiGe as a material of the second nano-objects allows a tensile stressing of the first nano-objects. The second nano-objects will then be removed in a later step. However, in view of the advantage that SiGe provides in relation to its selectivity of etching, it will preferably be used even if subsequently it is sought to set the first nano-objects in compression using particular electrode growth techniques as will be seen in more detail below.

In the present description, when the first nano-object 201 of the second structure 200, and more particularly its part 201c intended to form the associated channel area, is under compressive or tensile stress, it is understood that the compression, or the tension, is along the reference axis $A_{ref}$ passing through the first and second opposite ends 201a, 201b of the first nano-object 201. In other words, the first nano-object 201 has, either a tendency to be compressed, or a tendency to be stretched, along the corresponding reference axis $A_{ref}$. The compression or the tension of the channel area along the X-axis (or the reference axis $A_{ref}$) makes it possible to improve the mobility of the carriers according to the type of transistor (pMOS or nMOS).

Preferably, each first nano-object 101, 201, 301 has a thickness comprised between 4 nm and 20 nm. Furthermore, in the configuration illustrated in FIGS. 1 and 2, each first nano-object 101, 201, 301 preferably has a dimension, along the reference axis $A_{ref}$ passing through its first and second opposite ends 201a, 201b, comprised between 11 nm and 190 nm. In particular, along the reference axis $A_{ref}$, the (and notably each) corresponding first nano-object 201 comprises, under each of the first and second spacers 104a, 104b, a portion of dimension comprised between 3 nm and 20 nm, and a portion of dimension comprised between 5 nm and 150 nm between the first and second spacers 104a, 104b. Finally, each first nano-object may have a lateral dimension comprised between 5 nm and 100 nm.

Preferably, the second nano-objects 102, 202, 302 each have a thickness comprised between 6 nm and 20 nm. Furthermore, in the configuration illustrated in FIGS. 1 and 2, the second nano-objects 102, 202, 302 preferably each have, parallel to the reference axis of $A_{ref}$ passing through the first nano-object 101, 201, 301 arranged between said second nano-objects 102, 202, 302, a length comprised between 11 nm and 190 nm. Finally, each second nano-object may have a lateral dimension comprised between 5 nm and 100 nm.

These dimensions of the first and second nano-objects are all particularly suited for forming a transistor.

The substrate 1 previously mentioned may be a substrate made of, or comprising, silicon on insulator, or a bulk semiconductor substrate, e.g. made of silicon.

Figure 3:
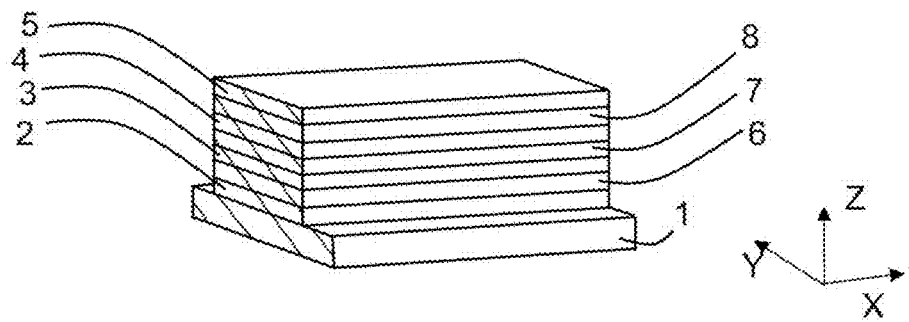
FIGS. 3 to 6 illustrate steps of the method of manufacturing notably making it possible to obtain what is represented in FIGS. 1 and 2, FIGS. 7 to 11 illustrate the steps of an embodiment of the method of manufacturing, FIG. 8 being a sectional view of FIG. 7 and FIG. 10 a sectional view of FIG. 9, FIGS. 12 to 15 illustrate steps of another embodiment of the method of manufacturing in perspective views.
Figure 4:
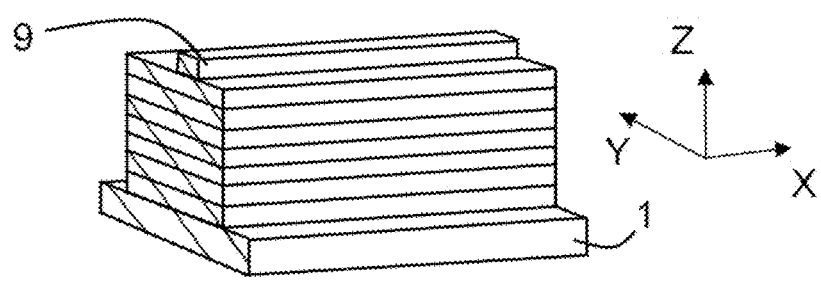
Figure 5:
Figure 6:
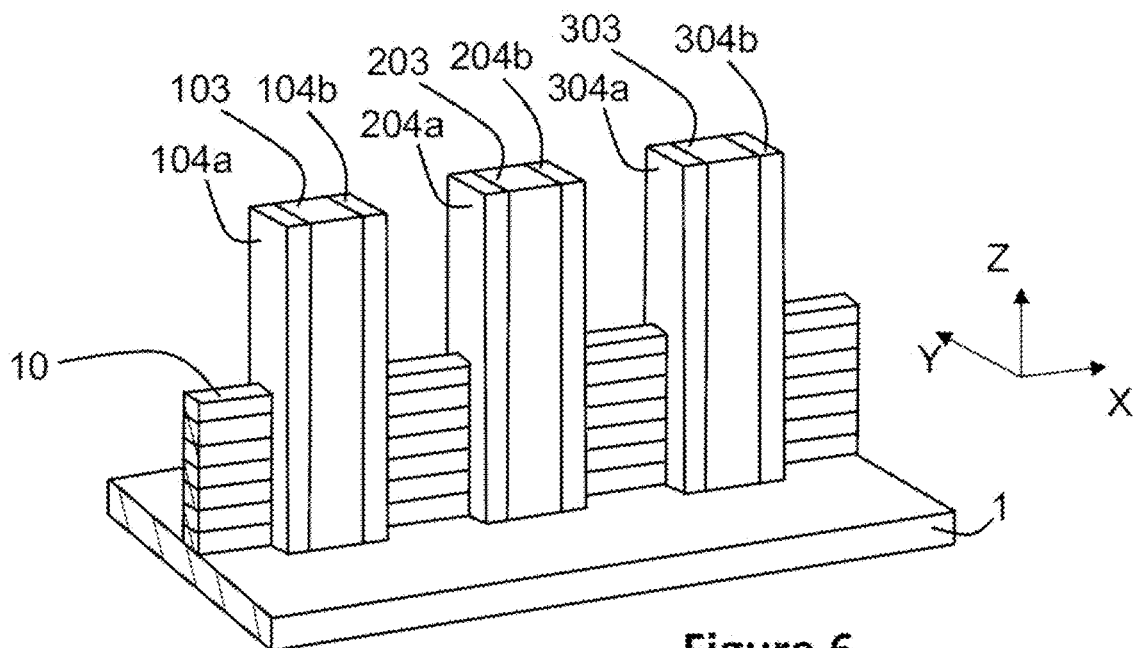

In order to form the first to third structures to be supplied mentioned previously, and therefore, where appropriate, the stacks of first and second nano-objects, it is possible to first produce, as illustrated in FIG. 3, a stack of semiconductor layers on the substrate 1, formed, for example, by epitaxy. This stack of semiconductor layers is formed by an alternation of layers 2, 3, 4, 5, made of material intended to form the second nano-objects and layers 6, 7, 8 made of material intended to form the first nano-objects. The layers 6, 7, 8 made of material intended to form the first nano-objects are preferably such that their lattice parameter corresponds to a relaxed state of said material. The layers 2, 3, 4, 5 made of material intended to form the second nano-objects are notably stressed by suiting their lattice parameter to that of the layers 6, 7, 8 made of material intended to form the first nano-objects and to that of the substrate 1. Each of the layers 2 to 8 has a thickness suited to the nano-object that it makes it possible to form. The layers 2, 3, 4, 5 intended to form the second nano-objects each have a thickness notably remaining less than the critical thickness beyond which the layer concerned would have a tendency to relax. This stack of layers formed on the substrate 1 may then be etched (FIGS. 4 and 5) according to a masking, e.g. by using a hard mask 9. The etching of the stack of layers may be dry isotropic (i.e. vertical) etching. At the end of the step of etching the stack of layers, and after removal of the hard mask 9, a stack of elongated elements is obtained as illustrated in FIG. 5 above the substrate 1.

If a substrate used for forming the stack of elongated elements 10 is made of SiGe on insulator, the stack of layers formed by epitaxy is notably produced starting from a layer of the substrate comprising SiGe obtained, for example, by Ge condensation methods known to the person skilled in the art. This SiGe layer of the substrate may then be used for forming at least one second nano-object made of sacrificial SiGe in contact with the insulator which will then form the substrate 1 as supplied: the etching making it possible to form the stack of elongated elements 10 may then be performed up to the insulator.

When the substrate is a bulk type of semiconductor substrate, e.g. made of silicon, the stack of layers may be etched at least up to the silicon substrate, or may continue into the silicon substrate so as to form a trench in the substrate (this makes it possible, for example, to obtain a better verticality of the stack of elongated elements).

It is possible to modify the substrate 1 by continuing the etching of the stack of layers into the substrate 1, then to fill the etched part of the substrate with an oxide, e.g. deposited by chemical vapor deposition (CVD). Such an oxide may be an oxide of silicon or $SiO_2$. Such an oxide may be TEOS type, TEOS being the abbreviation for "TetraEthyl Ortho-Silicate". In this way, the base of the stack of elongated elements 10 may be electrically insulated.

The elongated elements 10 obtained may have a parallel-epiped shape, and for each of these elongated elements the thickness and width correspond, where appropriate, either to those of the desired first nano-objects, or to those of the desired second nano-objects.

The sacrificial gates 103, 203, 303 may be formed on the stack of elongated elements 10 (FIG. 6) e.g. with the interposition of a protective material e.g. $SiO_2$ of a thickness suited to the protection function (e.g. a few nanometers). Each sacrificial gate 103, 203, 303, also called a "dummy gate", covers a corresponding part of the top of the stack of elongated elements 10, and covers the lateral flanks of a corresponding part of the elongated elements 10.

The first and second spacers 104a, 104b, 204a, 204b, 304a, 304b are then formed on each side of each of the sacrificial gates 103, 203, 303 (FIG. 6) so as to cover a corresponding part of the top of the stack of elongated elements 10, and a corresponding part of the lateral flanks of the stack of elongated elements 10. It is said that a pair of first and second spacers and the sacrificial gate taken between the spacers of said pair thus cover the nano-objects of a corresponding structure.

For forming the sacrificial gates 103, 203, 303 as well as the first and second spacers 104a, 104b, 204a, 204b, 304a, 304b, steps of lithography and etching are used which do not prejudice the stack of elongated elements 10 which therefore remains in place.

After forming the sacrificial gates 103, 203, 303, and the first and second spacers 104a, 104b, 204a, 204b, 304a, 304b, an etching, e.g. an anisotropic dry etching, is then performed for removing the non-covered parts of the elongated elements 10 of the stack which results in obtaining the first to third structures 100, 200, 300 which are supplied with the substrate 1 as illustrated in FIGS. 1 and 2.

Figure 7:
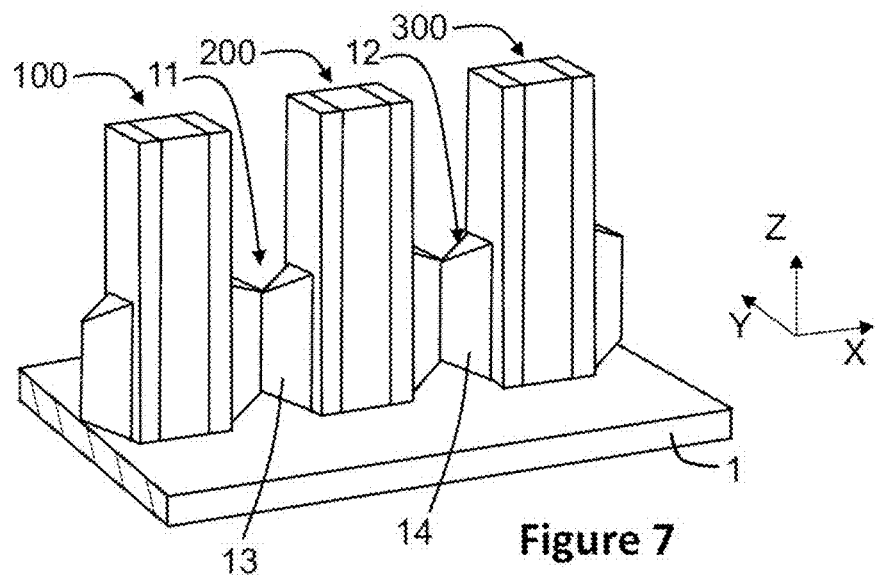
Figure 8:
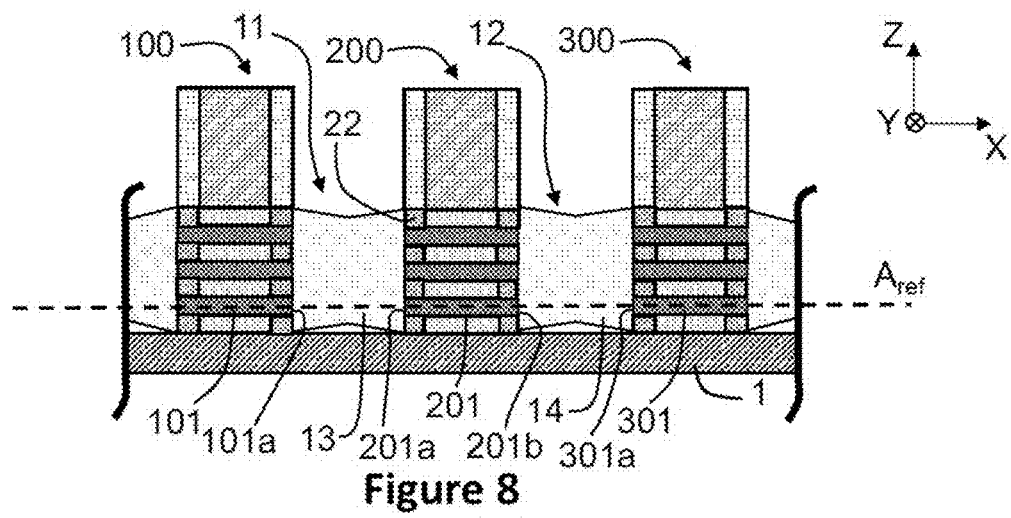

After the step of supplying the substrate 1, the method of manufacturing may comprise a step of forming electrodes, notably first and second electrodes, of the transistor. This step of forming electrodes is performed before the step of removing the sacrificial gate previously described. In FIGS. 7 and 8, although all of the electrodes are not represented, the references 11, 12 refer to the electrodes which are notably differentiated later in the present description as first and second electrodes of the transistor formed starting from the second structure 200. Where appropriate, the electrodes 11, 12 may be respectively a source electrode and a drain electrode, also known as a drain region, or a source region, in the field. More particularly, the step of forming electrodes 11, 12 comprises a step of epitaxial growth of a first material which results in obtaining a first continuity of matter 13 made of first material connecting, along the reference axis $A_{ref}$, the first end 201a of the first nano-object 201 of the second structure 200 to the first structure 100, and obtaining a second continuity of matter 14 made of first material connecting, along the reference axis $A_{ref}$, the second end 201b of the first nano-object 201 of the second structure 200 to the third structure 300. In the present description, "a continuity of matter connecting two things along the reference axis", is understood to mean that a straight line, included in the continuity of matter and merged with a longitudinal part of the reference axis, connects these two things. The first and second ends 201a, 201b of the first nano-object 201 are oriented respectively toward the first structure 100 and toward the third structure 300 so that the first and second continuities of matter 13, 14 connect, along the reference axis, the first nano-object 201 to the first and third structures 100, 300. Thus, at least a portion of the first continuity of matter 13 is formed, along the reference axis $A_{ref}$, in the extension of the first nano-object 201 for connecting its first end 201a to the first structure 100. Furthermore, at least a portion of the second continuity of matter 14 is formed, along the reference axis $A_{ref}$, in the extension of the first nano-object 201 for connecting its second end 201b to the third structure 300. These two continuities of matter 13, 14 make it possible to anchor the second structure 200 to the first and third structures 100, 300. The step of epitaxial growth of the first material is notably such that the growth is performed starting from at least the first nano-object 201 of the second structure 200 and starting from portions of the first and third structures 100, 300, or more particularly from the stacks of nano-objects of the first, second and third structures 100, 200, 300. These portions of the first and third structures 100, 300 are notably each oriented toward the first nano-object 201 of the second structure 200, and are notably each formed respectively by an end 101a of the first nano-object 101 of the first structure 100 and by an end 301a of the first nano-object 301 of the third structure 300 (FIG. 8). In particular, the reference axis $A_{ref}$ passing through the first and second ends 201a, 201b of the corresponding first nano-object 201 of the second structure 200 also passes through the portion of the first structure 100, and through the portion of the third structure 300 mentioned above. These anchorings offer the advantage of obtaining a solid mechanical base that will subsequently be used, thanks to a new epitaxy, for inducing the mechanical stress within the first nano-object 201 of the second structure 200. It is clear then that the step of forming electrodes also comprises a step of epitaxial growth of a second material (FIGS. 9 and 10), starting from the (i.e. notably from the, or on the) first material of the first and second continuities of matter 13, 14. The second material has a different lattice parameter from the (i.e. strictly greater or less than the) lattice parameter of the first material of the first and second continuity of matter 13, 14 which results in the second material, deposited by epitaxial growth on the first and second continuities of matter 13, 14, being stressed. In fact, the growth of the second material results in the formation of parts 15a, 15b of the first and second electrodes 11, 12 respectively on the first continuity of matter 13 and on the second continuity of matter 14 so that the second material of the parts 15a, 15b is stressed by the first material of the first and second continuities of matter 13, 14. Furthermore, the step of epitaxial growth of the second material results in the introduction of a desired stress within the, i.e. a stressing of the, first nano-object 201 of the second structure 200. Thus, the step of epitaxial growth of the second material results in the channel area being stressed (it is also said that the part 201c of the first nano-object 201 is stressed). In fact, it is the epitaxial growth of two materials between the first and second structures 100, 200 and between the second and third structures 200, 300 which makes it possible to induce the axial mechanical stress in the first nano-object 201 of the second structure 200 along the reference axis $A_{ref}$.

It is clear from what has been described above that the second material which it is desired to grow has, in a relaxed state, a different lattice parameter from the lattice parameter of the first material of the first and second continuities of matter 13, 14. Thus, during the growth of the second material on the first material, the second material adapts its lattice to that of the first material of the first and second continuities of matter 13, 14, this making it possible notably to induce the desired mechanical stress within the first nano-object 201 of the second structure, in particular in the part of the first nano-object intended to form the channel area of the transistor. "To induce a mechanical stress", is understood here to mean a tensile or compressive mechanical stress in the first nano-object 201 of the second structure 200 along the reference axis, i.e. between its first and second ends 201a, 201b. This stress is either generated, or obtained by modifying an initial stress. Furthermore, the growth of the second material may be such that it applies efforts on the first material so as to modify the initial stress of the first nano-object 201 of the second structure 200, e.g. by increasing or reducing it until an opposite stress is obtained. The opposite stress of tensile stress being compressive stress, and the opposite stress of compressive stress being tensile stress. The epitaxial growth of the first material and the epitaxial growth of the second material are particularly suited since the first material will be able to grow at least starting from (i.e. notably at least from) the first and second ends 201a, 201b of each first nano-object 201, and the second material will be able to grow starting from the (i.e. notably on the) first material of the first and second continuities of matter 13, 14 so as to apply a force on the latter which will then be expressed in tensile or compressive stressing of the first nano-object 201 of the second structure 200.

Figure 10:
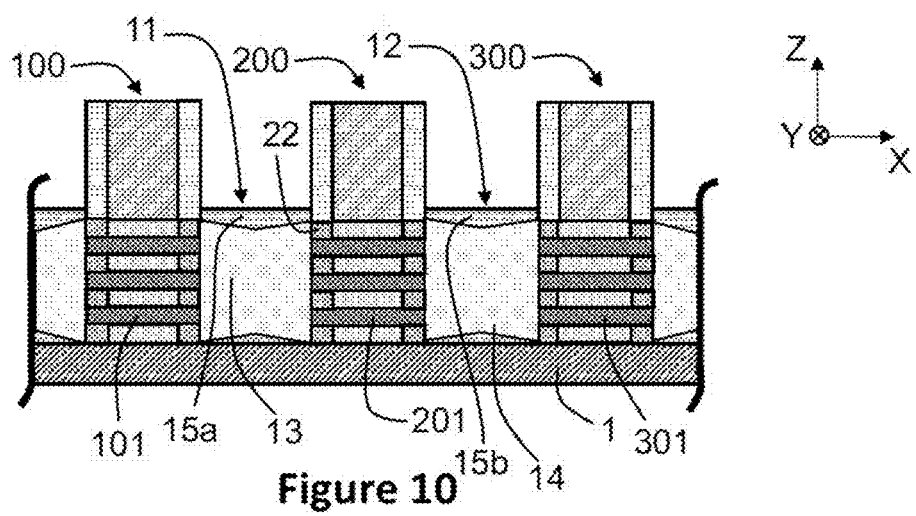

More precisely, the epitaxial growth of the first material will make it possible to simultaneously form for the second structure 200 the first and second continuities 13, 14 of matter which then form portions made of first material respectively of the first and second electrodes 11, 12 (FIGS. 7, 8, 10). In this respect, the first continuity of matter 13 is located between the first and second structures 100, 200 and connects the first nano-object(s) 101 of the first structure 100 to the first nano-object(s) 201 of the second structure 200. Furthermore, the second continuity of matter 14 may connect the first nano-object(s) 201 of the second structure 200 to the first nano-object(s) 301 of the third structure 300. In particular, at the end of the growth of the first material, the height of the first and second continuities 13, 14 of matter may correspond to that of the stack of nano-objects of the second structure 200, the width of the first and second continuities of matter 13, 14 may correspond to that of the stack of nano-objects.

Figure 9:
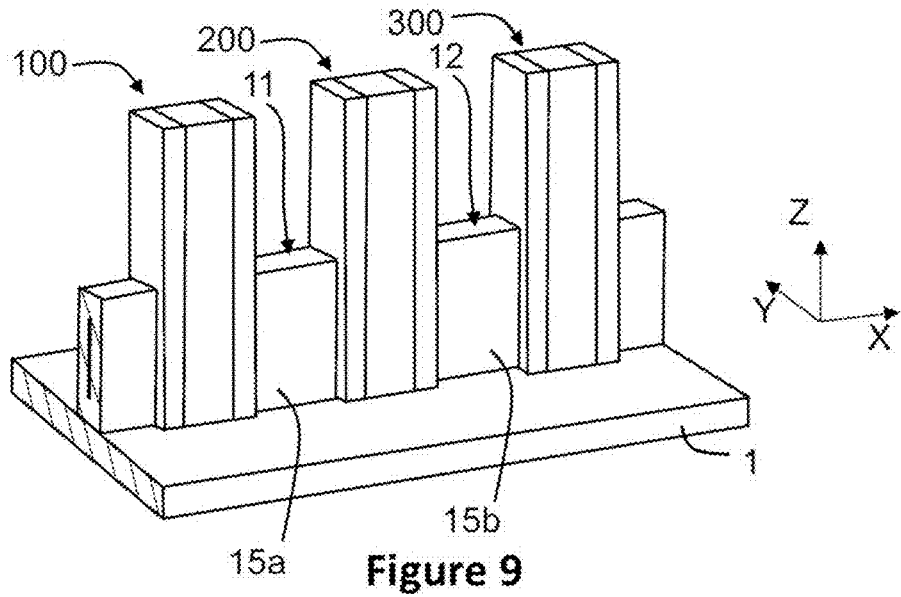

Then, the epitaxial growth of the second material makes it possible to simultaneously form the parts 15a, 15b made of second material respectively of the first and second electrodes 11, 12 (FIGS. 9 and 10). At the end of the growth of the second material, the first electrode 11 and the second electrode 12 may each have a height at least equal to that of the stack of nano-objects of the second structure 200, and a width at least equal to, or strictly greater than, that of the stack of nano-objects of the first structure 200.

In particular, for obtaining the compressive stress within the first nano-object 201 of the second structure 200, the second material has, notably in its relaxed state, a lattice parameter that is strictly greater than the lattice parameter of the first material of the first and second continuities of matter 13, 14. In particular, for inducing a tensile stress within the first nano-object 201 of the second structure 200, the second material has, notably in its relaxed state, a lattice parameter strictly less than the lattice parameter of the first material of the first and second continuities of matter 13, 14. It is clear that the stress seen within the first nano-object 201 of the second structure 200 is dependent on the electrodes formed from the two epitaxies. Furthermore, this stress although present at the end of the step of epitaxial growth of the second material will be able to be expressed more effectively within the channel area after the channel area is freed up, i.e. after etching the second nano-objects, notably made of SiGe, as will be seen later.

In general, the epitaxial growth of the second material is performed on the first and second continuities of matter 13, 14 made of first material, the stresses of which along the X-axis are not large, the first material forming the first and second continuities of matter 13, 14 is then considered as being relaxed.

The first material is notably a semiconductor and the second material is notably a semiconductor. The first material may be a semiconductor doped according to whether it is wished to form an nMOS or a pMOS transistor, the same goes for the second material. The person skilled in the art will be able to choose suitable doping.

In general, for the purpose of forming a pMOS transistor, the first material, preferably doped, may be silicon or silicon-germanium (i.e. a silicon-germanium alloy), and the second material, preferably doped, may be silicon-germanium. The atomic concentration or percentage in germanium within the second material is greater than the concentration in germanium within the first material when the latter comprises it. "Silicon" or "silicon-germanium", is understood to mean "silicon-based" or "silicon-germanium-based". Notably, the first material (doped or not doped) may be $Si_{(1-x)}Ge_x$ or Si, and the second material (doped or not doped) may be $Si_{(1-y)}Ge_y$ with x>0, y>0 and x being strictly less than y. Of course, there is also 1-x>0 and 1-y>0. Where appropriate, for a pMOS transistor, the dopant may be boron. Here, the doping may be performed by ion implantation or by epitaxy.

In the present description, "doped" is understood to mean an intentional doping for modifying the electrical properties of a compound.

For the purpose of forming an nMOS transistor, the epitaxial growth of the second material, on each side of each first nano-object 201 of the second structure 200, starting from the first material makes it possible to induce stress. According to another formulation the epitaxial growth of the second material makes it possible, where appropriate, to reinforce the tensile stress of each first nano-object 201 of the second structure 200. In the context of the manufacture of an nMOS transistor, the first material may be silicon and the second material silicon carbide doped with phosphorus or doped with arsenic.

When the first material, preferably doped, is silicon-germanium and the second material, preferably doped, is silicon-germanium, it is possible to distinguish between the following two cases:
  the second material has an atomic percentage of germanium strictly greater than the atomic percentage of germanium of the first material which results in a compression of the channel area,
  the second material has an atomic percentage of germanium strictly less than the atomic percentage of germanium of the first material which results in a tensioning of the channel area.

According to an example where the first material and the second material each comprise SiGe, the SiGe of the second material comprises 30% at to 60% at of germanium and at least 20% at of germanium more than the SiGe of the first material. Here, where appropriate, the doping of the SiGe (notably of the first material and of the second material) may be carried out with boron. "% at" corresponds to an atomic percentage. Such atomic percentages make it possible to induce a satisfactory compressive stress in the first nano-object 201 of the second structure 200. According to this example, a pMOS transistor is produced.

In order to ensure a suitable anchoring of the second structure 200 to the first and third structures 100, 300, the step of epitaxial growth may be implemented at least from the first, second and third structures 100, 200, 300.

When the substrate 1 is a semi-conductor substrate on electrical insulator, and the first to third structures 100, 200, 300 extend from the insulator, or more generally these structures are surrounded by an insulating surface of the substrate the, notably selective, epitaxial growth of the first material is only permitted from the areas of the first to third structures 100, 200, 300, in particular from at least the first and second ends of each first nano-object 101, 201, 301 coming from the first to third structures 100, 200, 300, and where appropriate, the opposite ends of the second nano-objects if they are free and therefore accessible. In other words, more generally, the substrate 1 may be such that it has, before the implementation of the step of epitaxial growth of the first material, a first free area 1a (FIGS. 1 and 2) connecting the first structure 100 to the second structure 200 and a second free area 1b connecting the second structure 200 to the third structure 300, the first and second free areas 1a, 1b being made of dielectric material from which the epitaxial growth of the first material is inhibited: this particularly applies to the first embodiment described below and has the advantage of limiting the quantity of first material within the first and second continuities of matter.

When the substrate is a bulk, e.g. silicon-based, substrate, the epitaxial growth of the first material may take place from the substrate and from the areas of the first to third structures, in particular from at least the free ends of the first nano-objects. In other words, more generally, the step of epitaxial growth of the first material may be such that said growth of the first material is also performed from the substrate, notably from a first free area 1a of the substrate located between the first and second structures 100, 200 (FIGS. 1 and 2) and from a second free area 1b of the substrate 1 located between the second and third structures 200, 300: this applies particularly to the second and third embodiments described below for best filling the confinement spaces described below. Here, these first and second free areas 1a, 1b are notably made of silicon. The advantage here lies in obtaining a difference of lattice parameter between the first and second materials.

Figure 11:
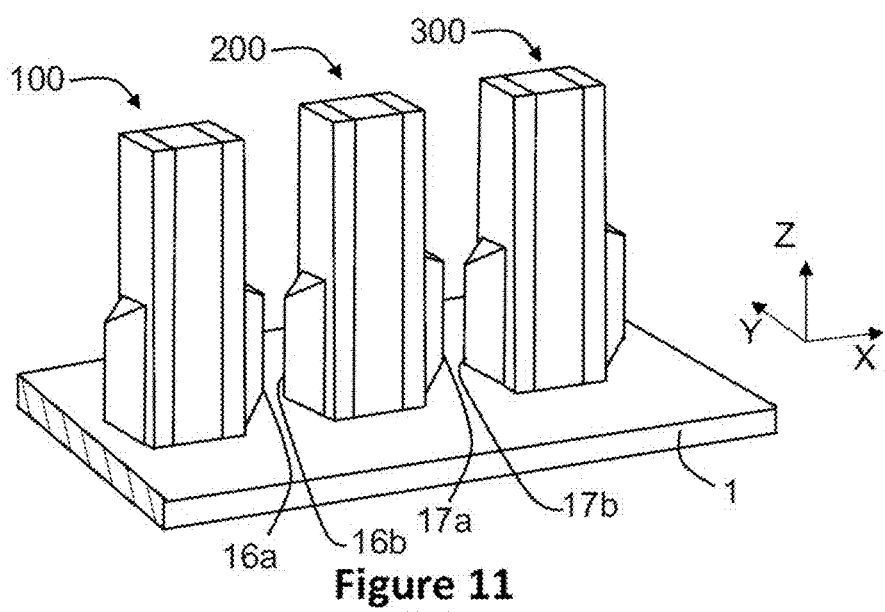
Figure 12:
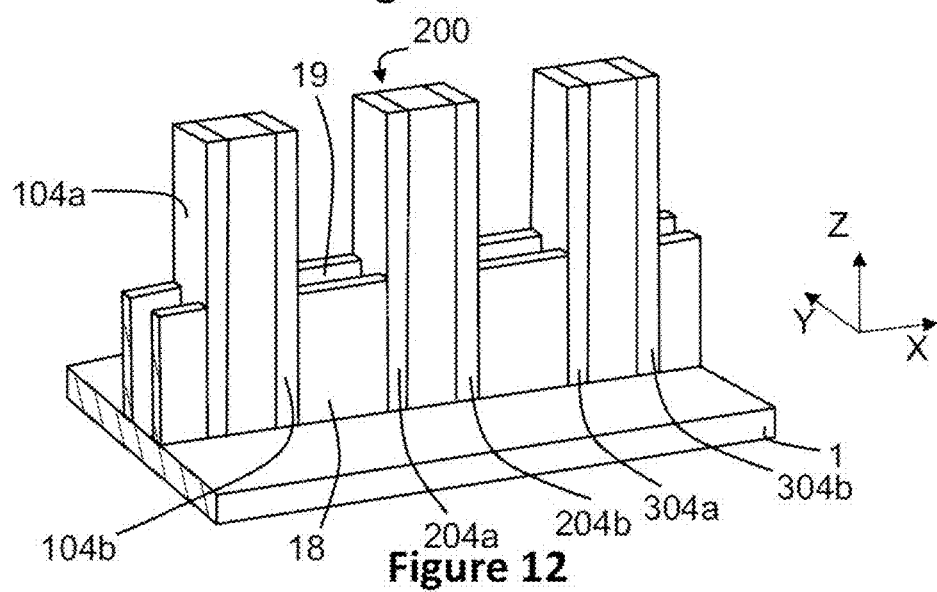
Figure 13:
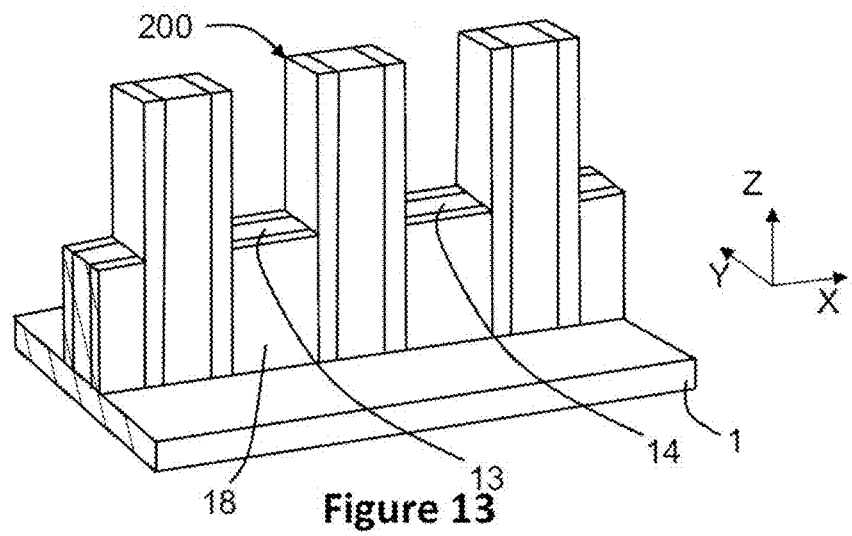
Figure 14:
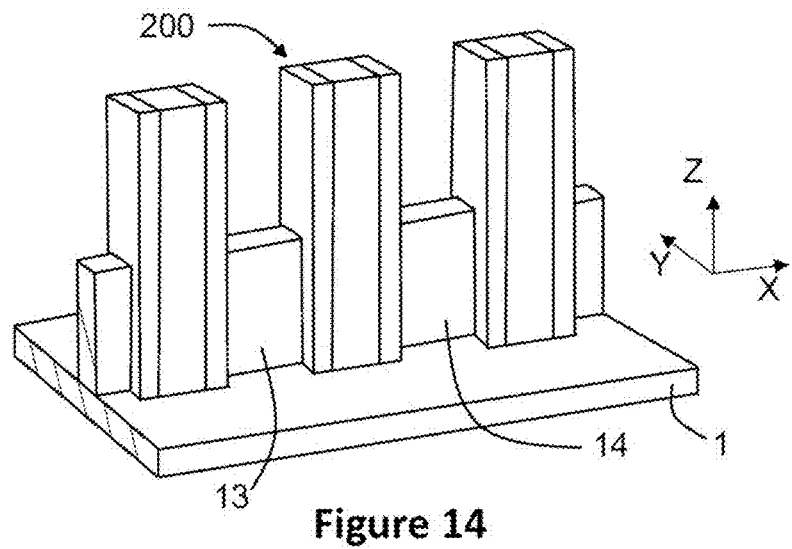

According to a first embodiment illustrated in FIGS. 7 to 11, the step of epitaxial growth of the first material takes place from the first to third structures 100, 200, 300, notably at least starting from (i.e. notably at least from) the first and second opposite ends of the first nano-objects 101, 201, 301. Thus, the step of epitaxial growth of the first material takes place (i.e. is performed) in such a way that:
between the first and second structures 100, 200, the first material grows, on the one hand, from the first structure 100 toward the second structure 200, and, on the other hand, from the second structure 200 toward the first structure 100 (as represented in FIG. 11) which results in the presence of two growth fronts 16a, 16b between the first and second structures 100, 200, and
between the second and third structures 200, 300 the first material grows, on the one hand, from the third structure 300 toward the second structure 200, and, on the other hand, from the second structure 200 toward the third structure 300 which results in the presence of two growth fronts 17a, 17b (FIG. 11) between the second and third structures 200, 300.

The growth fronts 16a, 16b, and the growth fronts 17a, 17b, will become closer together until making contact (FIGS. 7 and 8) for forming the first and second continuities of matter 13, 14 previously mentioned. In particular, according to this first embodiment, the step of epitaxial growth of the first material is stopped consecutively to, and preferably as soon as, the growth fronts 16a, 16b between the first and second structures 100, 200, and the growth fronts 17a, 17b between the second and third structures 200, 300, make contact. The advantage of stopping the epitaxial growth as soon as the growth fronts meet is to then be able to perform the second epitaxy by growing more second material in order to increase its volume and maximize the addition of stresses in each first nano-object 201 of the second structure 200. Preferably, the substrate 1 is here such that the first to third structures 100, 200, 300 extend from, i.e. are formed on, an electrical insulator of the substrate 1 e.g. $SiO_2$: this then becomes a case described above where the first and second free areas 1a, 1b of the substrate 1 are made of dielectric material from which the epitaxial growth of the first material is inhibited. The advantage of inhibiting the growth of the first material from the substrate 1 lies in limiting the quantity of first material in order to then ensure a suitable wrapping of the first material by the second material. At the end of the epitaxial growth of the first material the first and second continuities of matter 13, 14 may have facets such as those illustrated in FIG. 7. In this respect, the first continuity of matter 13 and the second continuity of matter 14 may have a thinning at the place where the growth fronts meet. The advantage of this particular shape of the first and second continuities of matter 13, 14 is that the epitaxial growth of the second material may be initiated as close as possible to the reference axis $A_{ref}$ (FIG. 8) passing through the first nano-object 201 of the second structure 200, a further advantage lying in having a larger volume of second material than the volume of first material deposited during its epitaxial growth in order to optimize the stress within the first nano-object 201 of the second structure 200. In particular, for each of the first and second continuities of matter 13, 14, two lateral facets of said continuity of matter are beveled and meet between the structures concerned. With regard to the first continuity of matter 13 of the first electrode 11, this comprises two portions each comprising two beveled lateral facets converging in the direction of a join (formed at the place where the two fronts meet) between the two portions of the first continuity of matter 13 of the first electrode 11, the same principle applies to the second electrode 12. In other words, the first continuity of matter 13 of the first electrode 11 is thinner at the join, the thinness being measured in a lateral direction orthogonal to the reference axis $A_{ref}$ and to a vector normal to the plane of the substrate 1. The advantage of this shape lies in making it possible to add second material, for forming the parts 15a, 15b, close to the reference axis $A_{ref}$, and to have a larger volume of second material for improving the stress induced in said first nano-object.

Figure 15:
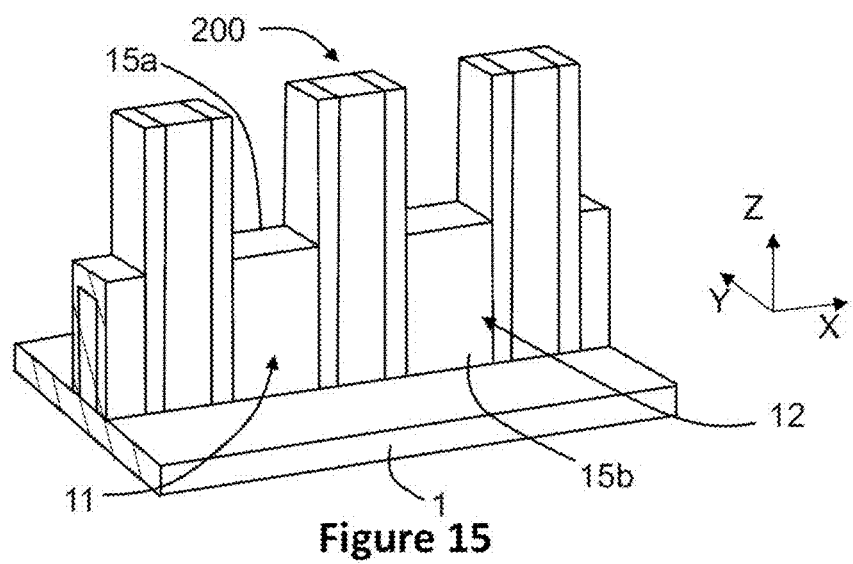
Figure 16:
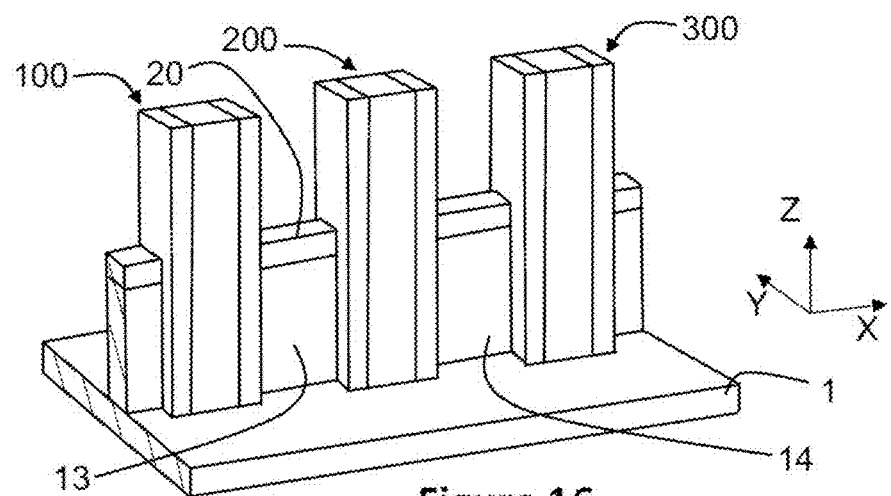
FIGS. 16 to 19 illustrate steps of yet another embodiment of the method of manufacturing in perspective views.
Figure 17:
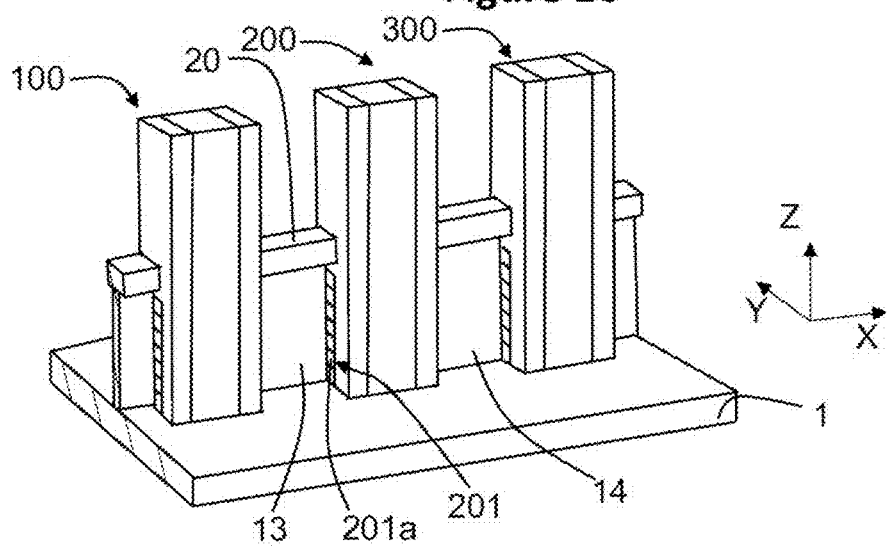

According to a second embodiment illustrated in FIGS. 12 to 15, the method of manufacturing may comprise a step of forming a growth mask 18 for forming confinement spaces 19 (FIG. 12) in which the epitaxial growth of the first material is performed (FIG. 13) for forming the first and second continuities of matter 13, 14 in particular by filling these confinement spaces with the first material. The method of manufacturing may further comprise, after the implementation of the step of epitaxial growth of the first material in the confinement areas, a step of removing the growth mask 18 before implementing the step of epitaxial growth of the second material. These confinement spaces 19 make it possible to better control the shapes and the desired dimensions of the first and second continuities of matter 13, 14 in order to optimize the stress induced in the first nano-object of the second structure 200 consecutively to the growth of the second material for forming the parts 15a, 15b made of second material of the first and second electrodes 11, 12 (FIG. 15). Preferably, the growth mask 18 is formed simultaneously with the first and second spacers 104a, 104b, 204a, 204b, 304a, 304b (FIG. 12) mentioned previously for limiting the number of technological steps of the method of manufacturing.

According to this second embodiment, the first material may grow during the epitaxy related to the step of epitaxial growth of the first material from the free areas 1a, 1b of the substrate 1 previously mentioned. In this case, the growth of the first material may take place in the confinement spaces 19 starting from the substrate 1 and the first to third structures 100, 200, 300 as has been previously mentioned. The growth from the substrate 1, notably at the bottom of the confinement spaces 19 makes it possible for the confinement spaces 19 to be filled homogeneously. Notably, before forming the growth mask 18, the free areas 1a, 1 b may have been obtained by etching the elongated elements 10 previously mentioned, and these free areas 1a, 1 b may be surrounded by the oxide filling parts removed from the substrate 1 during the etching of the stack of semiconductor layers: in this respect preferably only the free areas of the substrate 1 located between two adjacent structures and the channel area(s) are made of a material such as silicon allowing the epitaxial growth of the first material.

After growth of the first material (FIG. 13), the method of manufacturing comprises, according to the second embodiment, a step of removing the growth mask 18 (FIG. 14) before implementing the step of epitaxial growth of the second material as illustrated in FIG. 15 where the latter covers the first and second continuities of matter 13, 14 for forming the parts 15a, 15b of the first and second electrodes 11, 12 made of the second material. This step of removing the mask 18 notably makes it possible to make the flanks of the first and second continuity of matter 13, 14 accessible with a view to improving the stress induced in the first nano-object of the second structure 200 by the growth of the second material.

According to a third embodiment, illustrated in FIGS. 16 to 19, the step of forming electrodes may comprise a step of forming protections 20 arranged in the extension of the first and second continuities of matter 13, 14 so that the first and second continuities of matter 13, 14 are each arranged between one of the protections 20 and the substrate 1. The protections 20, also called covers or masks, are in contact respectively with the first and second continuities of matter 13, 14. These protections 20 may then be used to allow a lateral thinning down (FIG. 17) of the first and second continuities of matter 13, 14 by etching. In other words, the step of forming electrodes also comprises, after the step of forming protections 20, a step of lateral etching of the first material so as to thin down the first and second continuities of matter 13, 14 before implementing the step of epitaxial growth of the second material. "Thinning down" or "to thin down", in the present description is to understood to mean to make thinner, i.e. to reduce the width, along the Y-axis (i.e. in a direction orthogonal to the reference axis and to a vector normal to the face of the substrate 1 where the first to third structures 100, 200, 300, or more particularly the first and second continuities of matter 13, 14, are formed). The greater the thinning down, the greater the volume occupied by the second material may be between two adjacent structures, which will make it possible to improve the compressive or tensile stress of each first nano-object 201 of the second structure 200. Preferably, this third embodiment may be combined with the second embodiment in that the protections 20 may be produced from the configuration illustrated in FIG. 14, i.e. after the step of removing the growth mask 18 mentioned above and before the epitaxial growth of the second material: this offers the advantage of obtaining a geometry suited to the desired growth of the second material. Thinning down may be achieved by etching the first material, e.g. an anisotropic lateral etching, in particular dry or wet according to the materials present and the required selectivity. Preferably, if the lateral etching is such that it reaches the first nano-object of the second structure 200, it will take place by limiting the etching of this first nano-object under the first spacer or the corresponding second spacer.

Furthermore, at the end of the step of lateral etching, the distance (along the Y-axis) remaining between two opposite lateral flanks of the first and second continuities of matter 13, 14 may be equal to the dimension of the nano-objects along the Y-axis, but preferably strictly less than the dimension of the nano-objects along the Y-axis in order to improve the desired stressing of each first nano-object 201 of the second structure 200.

Thus, it is clear from what has been described above that the step of lateral etching, and therefore the thinning down of the first and second continuities of matter 13, 14 forming portions of the first and second electrodes, may be such that it makes it possible to reveal (see notably FIG. 17):
  on each side of the first continuity of matter 13, portions of the first end 201a of the first nano-object 201 of the second structure 200,
  on each side of the second continuity of matter 14, portions of the second end 201b of the first nano-object 201 of the second structure 200, The advantage of revealing portions of the first and second ends 201a, 201b of the, or of each, first nano-object 201 of the second structure 200 is to improve the tensile or compressive stress within said first nano-object 201 consecutively to the growth of the second material. In particular, the growth of the second material then also takes place starting from the revealed portions of the first and second ends 201a, 201b of the, or of each, first nano-object 201 of the second structure 200. The step of lateral etching is notably such that each first nano-object 201 of the second structure 200 comprises for each of its first and second ends 201a, 201b two corresponding revealed portions located respectively on each side of the continuity of matter. When portions of the nano-objects are revealed during the step of lateral etching, this may also induce a removal of matter from the revealed nano-objects, thus according to the type of etching, etching the first nano-object(s) 201 beyond a distance corresponding to the dimension of the first, or second, spacer 104a, 104b along the X-axis will be avoided. Of course, if the first and second continuity of matter 13, 14 are made of SiGe and the first nano-object 201 is made of Si, a selective lateral etching of the SiGe makes it possible to avoid etching the Si of the first nano-object 201.

Figure 18:
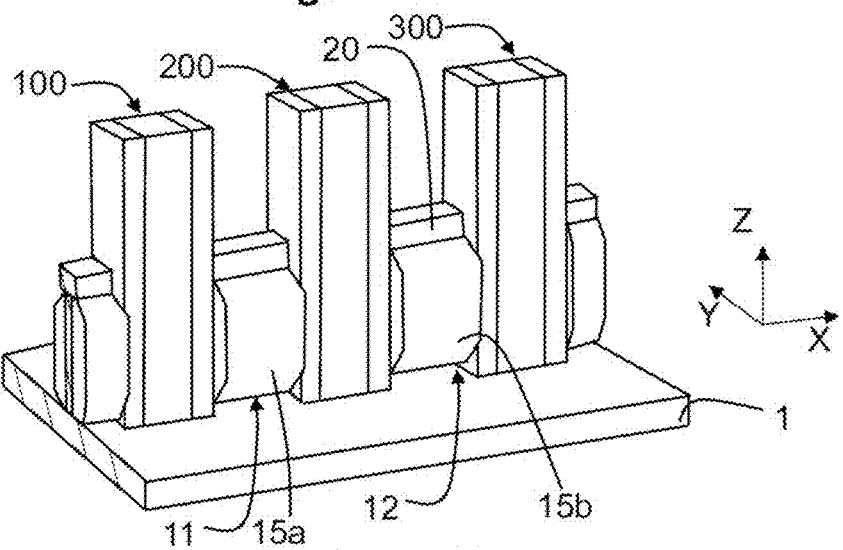
Figure 19:
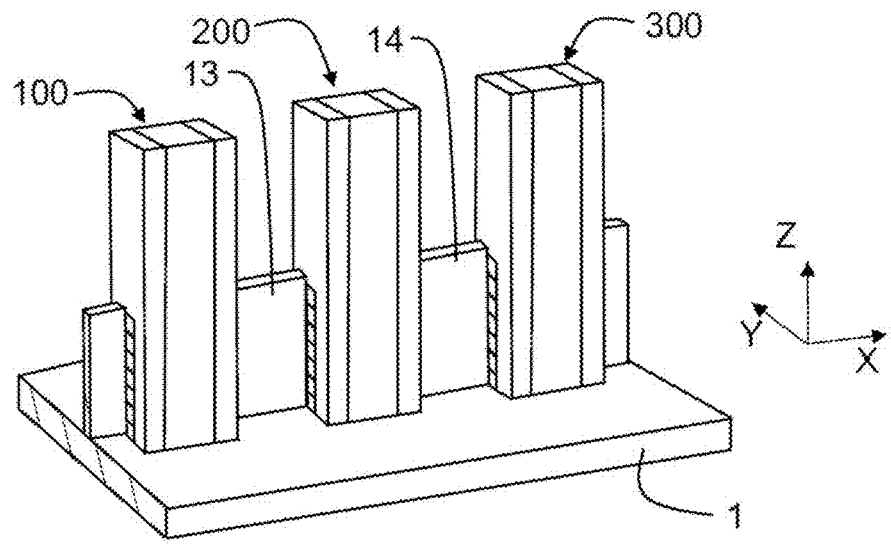

Subsequently, according to this third embodiment, after the step of lateral etching, the step of epitaxial growth of the second material for forming the parts 15a, 15b of the electrodes 11, 12 may be performed while the protections 20 are still present. FIG. 18 precisely illustrates the epitaxial growth of the second material which is performed while the protections 20 are present, which results in the formation of the parts 15a, 15b of the first and second electrodes 11, 12. Keeping the protections 20 offers the advantage of limiting the number of technological steps of the method of manufacturing. Alternatively, the method of manufacturing may comprise a step of removing the protections 20 in FIG. 17 before performing the step of epitaxial growth of the second material: this leads to the configuration of the type in FIG. 19 where the tops of the first and second continuities of matter 13, 14 are accessible for the growth of the second material. The growth of the second material may then make it possible to form the parts 15a, 15b of the electrodes 11, 12 covering the first and second continuities of matter as illustrated, for example, in FIG. 15. The removal of the protections 20 may be advantageous in that it allows the second material to occupy a larger volume and thus improve the stresses imposed in the channel area of the transistor.

In general, after the step of epitaxial growth of the second material, the method of manufacturing may comprise a step of annealing. The purpose of this step of annealing is to diffuse the atoms of the second material toward the first material so as to increase the stress within the, or each, first nano-object 201 of the second structure 200. In particular, when the first material comprises silicon, or silicon-germanium, and the second material comprises silicon-germanium, the method of manufacturing comprises, after the step of epitaxial growth of the second material, the step of annealing such that this results in the diffusion of germanium coming from the second material within the first material, i.e. in the first and second continuities of matter 13, 14 made of first material. This diffusion of germanium is made possible when the second material comprises a concentration in germanium strictly greater than the concentration in germanium of the first material. This makes it possible to increase the quantity of germanium within the first and second continuities of matter 13, 14 for increasing the compressive stress therein, and consequently increasing the compressive stress of the first nano-object 201 of the second structure 200. Such an annealing step may be performed at a temperature comprised between 800° C. and 1000° C., for example, at a pressure strictly less than 1 torr, and optionally under inert atmosphere or $H_2$. The step of annealing is notably implemented after a removal of the second nano-objects, notably for preventing the germanium that they comprise from diffusing into the channel area or areas.

According to an implementation applicable to everything that has been described above, internal spacers intended to separate the future gate electrode of the first and second electrodes of the transistor are formed for improving the performance of the transistor by reducing the parasitic capacitances. The forming of internal spacers is known per se. The internal spacers may be made of silicon nitride (SiN). The internal spacers may be formed before or after the step of forming electrodes described above, but before depositing a material intended to form a gate electrode of the transistor around the part 201c of the first nano-object 201 coming from the second 200 structure as will be described below. Preferably, and in particular when the second nano-objects and the source and drain electrodes 11, 12 are made of SiGe, the internal spacers are formed before the step of forming electrodes for preventing the removal of the SiGe, coming from the second nano-objects and located under the first and second spacers, with a view to producing the internal spacers, also from causing the etching of the electrodes made of SiGe.

Figure 20:
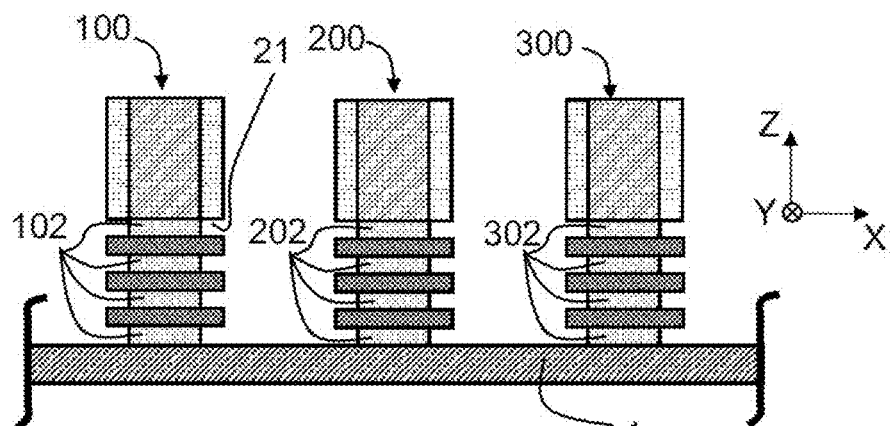
FIGS. 20 and 21 represent sectional views for illustrating the formation of internal spacers of the transistor.
Figure 21:
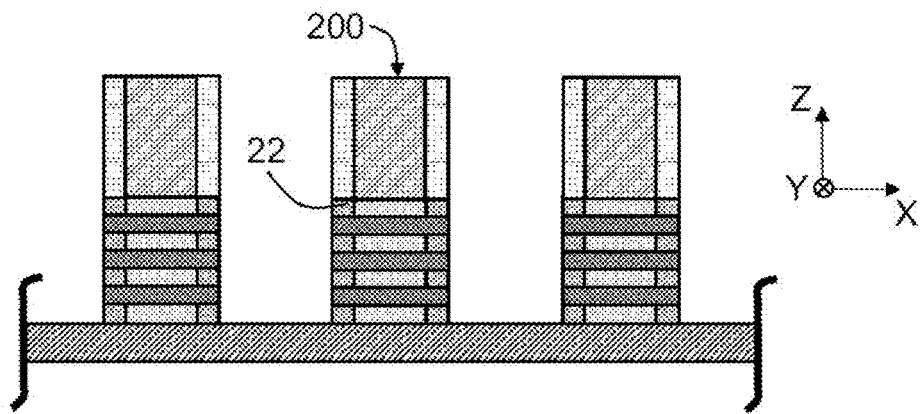

In the example described below, the internal spacers are formed before the step of forming electrodes. Starting then from FIG. 1 it is seen that each of the second nano-objects 202 of the second structure 200, and where appropriate the second nano-objects 102, 302 of the first and third structures 100, 300, comprises two end parts each arranged under one of the corresponding first or second spacers 104a, 104b, 204a, 204b, 304a, 304b. In other words, each end part of a second nano-object is covered by one of the corresponding first and second spacers. Furthermore, the method of manufacturing comprises as illustrated in FIG. 20, before the step of forming electrodes, a step of modifying, notably of shortening, the second nano-objects 102, 202, 302 by removing (notably by selective etching) each of the end parts of each of the second nano-objects 102, 202, 302 so as to form recesses 21. In FIG. 20, as there are twelve second nano-objects, twenty-four recesses 21 are formed starting from the first to third structures 100, 200, 300. The method of manufacturing further comprises, before the step of forming electrodes, a step of forming internal spacers 22 in the formed recesses 21 (FIG. 21). It is said then that the second structure 200 comprises internal spacers 22. Notably, the step of modifying the second nano-objects 102, 202, 302 is such that each end part of a second nano-object 102, 202, 302 corresponds to a segment of said second nano-object 102, 202, 302 of a dimension along the X-axis comprised between 3 nm and nm. In other words, the portions of the second nano-objects located under the first and second spacers are replaced by the internal spacers 22. Although in FIGS. 8 and 10 the first to third structures 100, 200, 300 comprise the internal spacers 22, they might not be present if the latter are not formed, or formed after the step of forming electrodes.

Finally, in general and applicable to all that has been described above, the method of manufacturing the transistor (FIG. 22) may comprise a step of forming a gate electrode 205 of the transistor which surrounds, preferably with the interposition of a gate insulator 206, the part 201c of the first nano-object 201 coming from the second structure 200 and intended to form the channel area of the transistor. Notably, the part 201c of the first nano-object 201 surrounded by the corresponding gate electrode 205 is arranged between the first and second spacers 204a, 204b in contact with the gate electrode 205. The gate electrode 205 described here is a gate-all-around electrode. "Interposition of the gate insulator 206", is understood to mean that the gate electrode 205 surrounds one or more first nano-objects 201 coming from the second structure 200, at least along a part of said first nano-object 201 located between its first and second ends 201a and 201b, but is not in direct contact with the first nano-object 201.

More precisely, before forming the gate electrode 205, the method of manufacturing comprises a step of removing the sacrificial gate 203 of the second structure 200 and a step of etching the second nano-objects 202 of the second structure 200 made accessible by the removal of the sacrificial gate 203 for freeing said, where appropriate each, part 201c of the first nano-object 201 (FIG. 23) of the second structure 200 intended to form the channel area of the transistor. Then the step of forming the gate electrode 205 makes it possible to form said gate electrode 205 between the first and second spacers 204a, 204b coming from the second structure 200.

The gate insulator 206 mentioned in the present description may comprise an "interfacial" oxide like $SiO_2$ deposited on the first nano-object 201 of the second structure 200, the deposited thickness of the oxide may range from an atomic layer thickness of said oxide to 2 nm, combined with a "High-k" material meaning a high-k dielectric constant material, e.g. $HfO_2$ deposited in a thickness generally comprised between 1 nm and 2 nm. The $SiO_2$ is then inserted between the corresponding first nano-object 201 and the "High-k" material.

The gate electrode material may be TiN deposited in a thickness, for example, of 5 nm. The person skilled in the art may also use other types of suitable materials.

Figure 22:
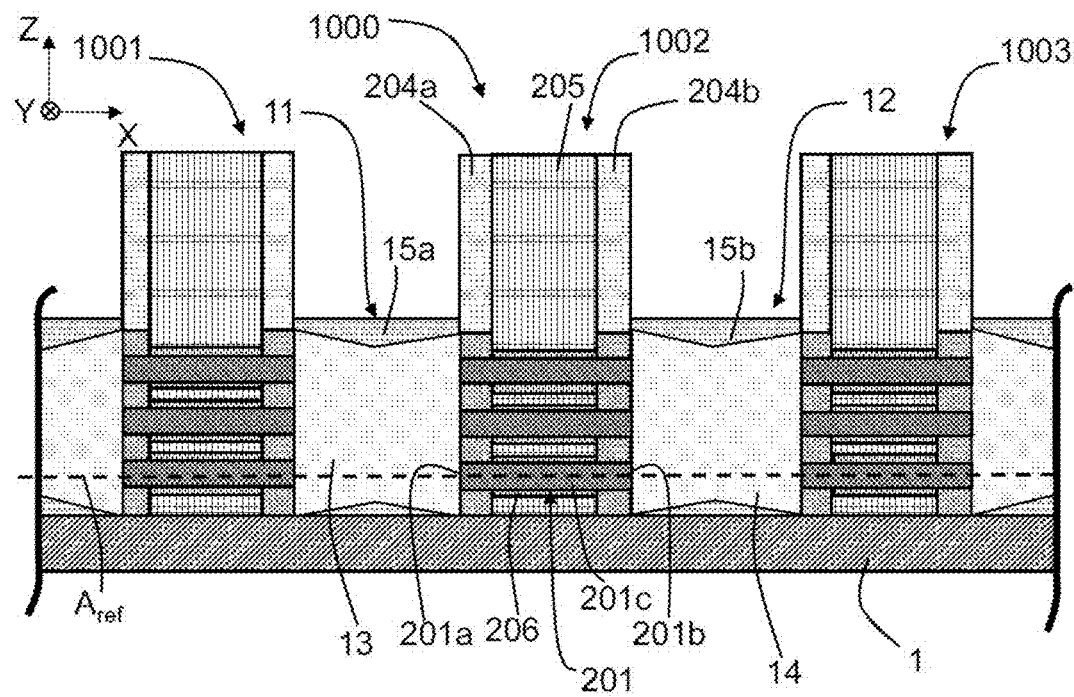
FIGS. 22 and 23 represent sectional views for illustrating the formation of at least one gate electrode of the transistor.
Figure 23:
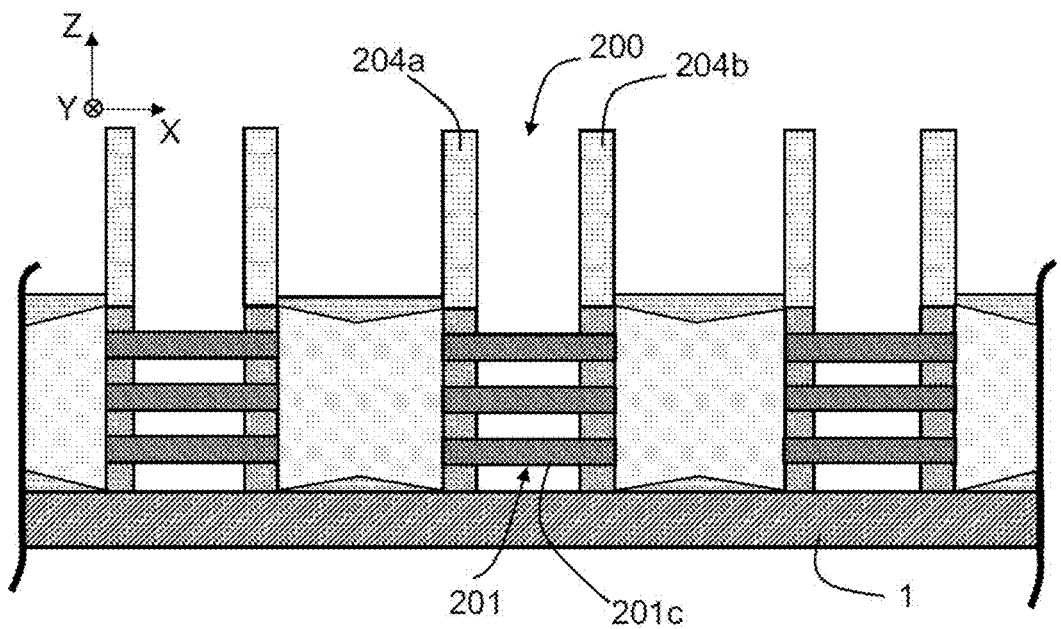

It is clear from what has previously been described, that the invention also relates to an electronic device illustrated in FIG. 22 offering the advantages described in relation to the method of manufacturing. The electronic device comprises said at least one transistor 1000, the substrate 1 surmounted by first, second, and third elements 1001, 1002, 1003, the second element 1002 being arranged between the first and third elements 200, 300, the second element 1002 comprising said at least one nano-object 201. The transistor is provided with a channel area formed by the part 201c of the nano-object 201, said nano-object 201 comprising first and second opposite ends 201a, 201b along the reference axis $A_{ref}$ passing through first and second ends 201a, 201b and preferably through the first and third elements 1001, 1003. Furthermore, the electronic device is such that:
the first end 201a of the nano-object 201 is connected to the first element 1001 via the first electrode 11 of the transistor, said first electrode 11 comprising:
a first part forming the first continuity of matter 13 between said first end 201a and the first element 1001,
a second part 15a formed on said first part,
the second end 201b of the nano-object 201 is connected to the third element 1003 via the second electrode 12 of the transistor, said second electrode 12 comprising:
a first part forming the second continuity of matter 14 between said second end 201b and the third element 1003,
a second part 15b formed on said first part,
the first parts of the first and second electrodes 11, 12 being formed of a first material and the second parts of the first and second electrodes 11, 13 being formed of a second material, the lattice parameter of the second material being suited to that of the first material so as to induce a stress in the nano-object 201 along the reference axis passing through the first and second ends 201a, 201b of the nano-object 201.

Notably, the first to third elements 1001, 1002, 1003 each form a structure which comprises parts respectively coming from the first to third structures and which have not been removed in the course of the method of manufacturing. In particular, the first nano-object(s), the first and second spacers, and, where appropriate, the internal spacers, may remain from the initial structure.

It is clear from all that has been described above that electrodes, notably source and drain electrodes, are judiciously used for inducing a desired stress in a nano-object, a part of which is intended to form a transistor channel area. The fact that the stress seen by the first nano-objects is induced by the electrodes of two transistors makes it possible to improve maintaining this stress even after etching the second nano-objects.

The person skilled in the art will be able to choose the type of the first and second electrodes. For example, the first electrode may be a source electrode and the second electrode a drain electrode or vice versa.

The method of manufacturing may also comprise a step of encapsulating the electrodes formed by the two steps of epitaxial growth before removing/etching the sacrificial gates. After forming the gate electrode, contacts may be formed on the gate electrode as well as the first and second electrodes, where appropriate after partial removal of the encapsulation of the electrodes.

It is also clear from what has been described above that the method of manufacturing described above may also make it possible to manufacture a plurality of transistors. In this case, the step of supplying the substrate surmounted by first to third structures is such that each of the first to third structures comprises at least one first nano-object located away from the substrate, a part of the first nano-object of the first structure being intended to form a channel area of a first transistor, the part of the first nano-object of the second structure being intended to form a channel area of a second transistor, and a part of the first nano-object of the third structure being intended to form a channel area of a third transistor.

We claim:

1. An electronic device comprising at least one transistor and a substrate surmounted by first, second, and third elements, the second element being arranged between the first and the third elements, the second element comprising at least one nano-object and the transistor being provided with a channel area formed by a part of the nano-object, the nano-object comprising first and second opposite ends along a reference axis passing through the first and the second opposite ends, wherein:
the first end of the nano-object is connected to the first element via a first electrode of the transistor, the first electrode comprising:
a first part forming a first continuity of matter between the first end and the first element, and
a second part formed on the first part,
the second end of the nano-object is connected to the third element via a second electrode of the transistor, the second electrode comprising:
a first part forming a second continuity of matter between the second end and the third element, and
a second part formed on the first part,
the first parts of the first and the second electrodes being formed of a first material and the second parts of the first and the second electrodes being formed of a second material, a lattice parameter of the second material being suited to a lattice parameter of the first material so as to induce a stress in the nano-object along the reference axis, and
the second parts of the first and the second electrodes each form a continuity of matter, respectively, between the first and the second elements and between the second and the third elements.

2. The electronic device according to claim 1, wherein the first to the third elements are aligned along the reference axis.

3. The electronic device according to claim 1, wherein two adjacent transistors share the same electrode.

4. The electronic device according to claim 1, wherein the at least one transistor comprises a gate electrode arranged between a first spacer and a second spacer in contact with the gate electrode, the first spacer and the second spacer extending from the substrate.

5. The electronic device according to claim 4, wherein the nano-object has:
- a thickness comprised between 4 nm and 20 nm, and/or
- a dimension, along the reference axis, comprised between 11 nm and 190 nm, and/or
- a lateral dimension comprised between 5 nm and 100 nm, and/or
- along the reference axis and under each of the first and the second spacers, a portion of dimension comprised between 3 nm and 20 nm, and/or
- along the reference axis and between the first and the second spacers, a portion of dimension comprised between 5 nm and 150 nm, and/or
- wherein a distance between two opposite lateral flanks of the first and the second continuities of matter is equal to, or strictly less than, the lateral dimension of the nano-object.

6. The electronic device according to claim 4, further comprising an internal spacer separating the gate electrode from the first and the second electrodes.

7. The electronic device according to claim 6, wherein the internal spacer is made of silicon nitride.

8. The electronic device according to claim 4, wherein the gate electrode surrounds the part of the nano-object and wherein a gate insulator is interposed between the gate electrode and the part of the nano-object, the gate insulator comprising an interfacial oxide deposited on the nano-object.

9. The electronic device according to claim 8, wherein the interfacial oxide has a thickness ranging from an atomic layer thickness of the oxide to 2 nm.

10. The electronic device according to claim 4, wherein a material of the gate electrode is TiN.

11. The electronic device according to claim 4, wherein the first and the second electrodes are encapsulated, and contacts are arranged on the gate electrode, the first electrode, and the second electrode.

12. The electronic device according to claim 1, wherein the first material is silicon or silicon-germanium, and the second material is silicon-germanium.

13. The electronic device according to claim 12, wherein the first material and the second material are doped.

14. The electronic device according to claim 1, wherein the first material is $Si_{(1-x)}Ge_x$ or Si, and the second material is $Si_{(1-y)}Ge_y$, with $x>0$, $y>0$, and x being strictly less than y.

15. The electronic device according to claim 1, wherein the substrate is made of, or comprises, silicon-on-insulator, or the substrate is a bulk semiconductor substrate.

16. The electronic device according to claim 1, wherein the first part of the first electrode and the first part of the second electrode are obtained by epitaxial growth from at least the first and the second opposite ends of the nano-object.

17. The electronic device according to claim 1, wherein the second parts of the first and the second electrodes are obtained by epitaxial growth from the first material of the first and the second continuities of matter.

18. The electronic device according to claim 1, wherein the at least one transistor is an nMOS transistor or a pMOS transistor, and wherein the first and the second materials are doped, the doping being dependent on whether the transistor is nMOS or pMOS.

19. The electronic device according to claim 1, wherein each of the first and the second continuities of matter comprises two portions each comprising two beveled lateral facets converging in a direction of an interface between the two portions.

20. The electronic device according to claim 1, wherein the second part of the first electrode covers the first part of the first electrode, and wherein the second part of the second electrode covers the first part of the second electrode.

* * * * *